(12) United States Patent
Lekselius et al.

(10) Patent No.: US 12,218,402 B2
(45) Date of Patent: Feb. 4, 2025

(54) DEVICE FOR SECURING AND RELEASING A FIRST MODULE AND A SECOND MODULE IN A SPACE

(71) Applicant: Huawei Technologies Co., Ltd., Guangdong (CN)

(72) Inventors: Niklas Lekselius, Kista (SE); Stefan Bornholm, Kista (SE)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 504 days.

(21) Appl. No.: 17/643,634

(22) Filed: Dec. 10, 2021

(65) Prior Publication Data

US 2022/0102829 A1 Mar. 31, 2022

Related U.S. Application Data

(63) Continuation of application No. PCT/EP2019/065571, filed on Jun. 13, 2019.

(51) Int. Cl.
*H01Q 1/12* (2006.01)
*H01Q 1/00* (2006.01)
(Continued)

(52) U.S. Cl.
CPC ............... *H01Q 1/12* (2013.01); *H01Q 1/005* (2013.01); *H01R 11/22* (2013.01); *H01R 13/627* (2013.01);
(Continued)

(58) Field of Classification Search
CPC .......... H01Q 1/12; H01Q 1/005; H01R 11/22; H01R 13/627; H01R 13/6275;
(Continued)

(56) References Cited

U.S. PATENT DOCUMENTS 5,152,694 A 10/1992 Bargain
5,259,781 A 11/1993 Baumberger et al.
(Continued)

FOREIGN PATENT DOCUMENTS

CN 101036425 A 9/2007
CN 105828557 A * 8/2016 ........... H05K 5/0217
(Continued)

*Primary Examiner* — Justin M Kratt
(74) *Attorney, Agent, or Firm* — WOMBLE BOND DICKINSON (US) LLP (57) ABSTRACT

The disclosure relates to a device for securing a first module and a second module in a space between a first mount and a second mount. The device comprises a biasing apparatus configured to urge the first module and the second module away from each other, thereby urging the first module against the first mount and urging the second module against the second mount. Further, the device comprises a release apparatus configured to move the first module and the second module toward each other, thereby moving the first module away from the first mount and moving the second module away from the second mount. The device provides an uncomplicated and flexible mounting and demounting of the first module and second module, thus attaining a flexible and uncomplicated attachment of each module to the respective mount and a flexible and uncomplicated detachment of each module from the respective mount.

20 Claims, 8 Drawing Sheets

(51) Int. Cl.
  *H01R 11/22* (2006.01)
  *H01R 13/627* (2006.01)
  *H05K 7/14* (2006.01)
  *H05K 7/20* (2006.01)
  *H01R 13/62* (2006.01)

(52) U.S. Cl.
  CPC ....... *H01R 13/6275* (2013.01); *H05K 7/1401* (2013.01); *H05K 7/2049* (2013.01); *H05K 7/20536* (2013.01); *H05K 7/20945* (2013.01); *H01R 13/62* (2013.01); *H05K 7/1402* (2013.01); *H05K 7/1405* (2013.01); *H05K 7/20* (2013.01); *H05K 7/20381* (2013.01); *H05K 7/2039* (2013.01); *H05K 7/20436* (2013.01); *H05K 7/206* (2013.01); *H05K 7/207* (2013.01); *H05K 7/209* (2013.01)

(58) Field of Classification Search
  CPC .... H01R 13/62; H05K 7/1401; H05K 7/2049; H05K 7/20536; H05K 7/20945; H05K 7/1402; H05K 7/1405; H05K 7/20; H05K 7/20381; H05K 7/2039; H05K 7/20436; H05K 7/206; H05K 7/207; H05K 7/209
  See application file for complete search history.

(56) References Cited

U.S. PATENT DOCUMENTS

| | | |
|---|---|---|
| 5,800,193 A | 9/1998 | Tsubakihara et al. |
| 2013/0000865 A1 | 1/2013 | Shi |

FOREIGN PATENT DOCUMENTS

| | | | | |
|---|---|---|---|---|
| CN | 107852837 A | | 3/2018 | |
| CN | 108055597 A | * | 5/2018 | ............... H04Q 1/11 |
| EP | 0151546 A2 | * | 8/1985 | |
| EP | 2689646 A1 | | 1/2014 | |
| WO | 2012126748 A1 | | 9/2012 | |

* cited by examiner

DEVICE FOR SECURING AND RELEASING A FIRST MODULE AND A SECOND MODULE IN A SPACE

CROSS-REFERENCE TO RELATED APPLICATIONS

This application is a continuation of International Application No. PCT/EP2019/065571, filed on Jun. 13, 2019, the disclosure of which is hereby incorporated by reference in its entirety.

TECHNICAL FIELD

The disclosure relates to a device for securing a first module and a second module in a space between a first mount and a second mount. The disclosure also relates to an arrangement comprising a device of the above-mentioned sort. The arrangement also comprises the first mount and the second mount. Further, the disclosure relates to a network access node for a wireless communication system, wherein the network access node comprises an arrangement of the above-mentioned sort. The network access node may comprise a base station.

BACKGROUND

In various fields of technologies, for example in the field of telecommunications, various components, for example electrical components, are mounted to various units. For example, in the field of telecommunications, electrical components are mounted to a network access node, an active antenna, a remote radio unit (RRU) or a base band processor. In some conventional solutions, the attachment of an electrical component to a unit and the detachment of the electrical component from a unit, for example for maintenance or replacement, are complicated and not flexible.

SUMMARY

An object of embodiments of the disclosure is to provide a solution which mitigates or solves the drawbacks and problems of conventional solutions.

The above and further objects are solved by the subject matter of the independent claims. Further advantageous embodiments of the disclosure can be found in the dependent claims.

According to a first aspect of the disclosure, the above mentioned and other objects are achieved with a device for securing a first module and a second module in a space between a first mount and a second mount. The device comprises:

a biasing apparatus for urging the first module and the second module away from each other, thereby urging the first module against the first mount and urging the second module against the second mount, and a release apparatus for moving the first module and the second module toward each other, thereby moving the first module away from the first mount and moving the second module away from the second mount.

An advantage of the device according to the first aspect is that an uncomplicated, flexible and efficient mounting and demounting of the first and second modules are provided. Thus, a flexible and uncomplicated attachment of each module to the respective mount and a flexible and uncomplicated detachment of each module from the respective mount are attained. An advantage of the device according to the first aspect is that an improved attachment, or mounting, and an improved detachment, or demounting, of the first and second modules are provided. Further, the device also provides an efficient transfer of heat generated by the first module and/or second module from the first module and/or second module to the first mount and/or second mount, whereby the first module and/or second module and/is can be efficiently cooled.

In an embodiment of the device according to the first aspect, the first module has a first contact surface configured to abut against the first mount, wherein the second module has a second contact surface configured to abut against the second mount.

In an embodiment of the device according to the first aspect, the device comprises the first module and the second module. In an embodiment of the device according to the first aspect, the device comprises the first mount and the second mount.

In an embodiment of a device according to the first aspect, the first module has a first contact surface configured to abut against the first mount, wherein the second module has a second contact surface configured to abut against the second mount, and wherein the release apparatus is configured such that when first module and the second module are moved toward each other the distance between the first contact surface and the second contact surface is less than the distance between the first mount and the second mount. An advantage with this embodiment is that the mounting of the first and second modules and the demounting of the first and second modules are further improved.

In an embodiment of a device according to the first aspect, the release apparatus comprises a core unit located at least partly between the first module and the second module, wherein the first and second modules are attached to the core unit and movable in relation to the core unit. The core unit may be movable in relation to the first and second modules in a direction substantially parallel to the first and second contact surfaces.

In an embodiment of a device according to the first aspect, the release apparatus comprises a core unit located at least partly between the first module and the second module, wherein the first and second modules are attached to the core unit and movable in relation to the core unit, and wherein the release apparatus comprises a grip attached to the core unit and configured to move the core unit and thereby move the first and second modules in relation to the core unit. An advantage with this embodiment is that the mounting of the first and second modules and the demounting of the first and second modules are further improved.

In an embodiment of a device according to the first aspect, the device comprises a fixing element, wherein the core unit is movable in relation to the fixing element, wherein the first module and the second module are movable in relation to the fixing element, and wherein the grip is movable in relation to the fixing element. An advantage with this embodiment is that an efficient guidance of core unit and the first and second modules is attained, whereby the mounting of the first and second modules and the demounting of the first and second modules are further improved.

In an embodiment of a device according to the first aspect, the release apparatus comprises one or more core guides, wherein each core guide has a longitudinal extension and a core guide member movable in the core guide, wherein the core guide is configured to hold and guide the core guide member, and wherein the release apparatus is configured to move the first module and the second module in relation to each other by moving the core guide member along the longitudinal extension of the core guide. An advantage with this embodiment is that the first and second modules are guided in an uncomplicated manner, whereby the mounting of the first and second modules and the demounting of the first and second modules are further improved. A plurality of core guides, for example two core guides, may share the same core guide member.

In an embodiment of a device according to the first aspect, the longitudinal extension of the core guide forms an acute angle with the first and second contact surfaces. An advantage with this embodiment is that an efficient guidance of the first and second modules toward and away from the first and second mounts, respectively, is attained, whereby the mounting of the first and second modules and the demounting of the first and second modules are further improved.

In an embodiment of a device according to the first aspect, the core guide comprises a groove having the longitudinal extension, wherein the core guide member is configured to engage the groove and is movable in the groove, and wherein the release apparatus is configured to move the first module and the second module in relation to each other by moving the core guide member along the longitudinal extension of the groove. An advantage with this embodiment is that the first and second modules are guided in an efficient manner, whereby the attachment of the first and second modules against the first and second mounts, respectively, is further improved. Further, the detachment of the first and second modules is also improved.

In an embodiment of a device according to the first aspect, the biasing apparatus comprises one or more compression springs, wherein when the first and second modules are moved toward each other by the release apparatus the release apparatus is configured to compress the compression spring such that the compression spring is more compressed compared to when the first module is urged against the first mount and the second module is urged against the second mount. An advantage with this embodiment is that an efficient guidance of the first and second modules is attained, whereby the attachment of the first and second modules against the first and second mounts, respectively, is further improved.

In an embodiment of a device according to the first aspect, the first module comprises a first heat source, wherein the first module is configured to transfer heat from the first heat source to the first mount when the first module is urged against the first mount. An advantage with this embodiment is that an efficient transfer of heat is attained from the first heat source to the first mount because of the efficient attachment of the first and second modules to the first and second mounts provided by the embodiments of the device. Because of the above-mentioned efficient transfer of heat, an improved cooling of the first module can be provided.

In an embodiment of a device according to the first aspect, the first module comprises a first heat sink thermally coupled to the first heat source and configured to abut against the first mount. An advantage with this embodiment is that the transfer of heat from the first heat source to the first mount is further improved, whereby the cooling of the first module can be further improved.

In an embodiment of a device according to the first aspect, the second module comprises a second heat source, wherein the second module is configured to transfer heat from the second heat source to the second mount when the second module is urged against the second mount. An advantage with this embodiment is that an efficient transfer of heat is attained from the second heat source to the second mount because of the efficient attachment of the first and second modules to the first and second mounts provided by the embodiments of the device. Because of the efficient heat transfer from the second heat source to the second mount, an improved cooling of the second module can be attained.

In an embodiment of a device according to the first aspect, the second module comprises a second heat sink thermally coupled to the second heat source and configured to abut against the second mount. An advantage with this embodiment is that the transfer of heat from the second heat source to the second mount is further improved, whereby the cooling of the second module can be further improved.

In an embodiment of a device according to the first aspect, at least one of the first and second modules comprises a printed circuit board, wherein the printed circuit board comprises at least one of the first and second heat sources. An advantage with this embodiment is that an uncomplicated and improved mounting and demounting of a printed circuit board is provided. Another advantage with this embodiment is that an efficient cooling of the printed circuit board can be attained, because of the efficient transfer of heat from the respective heat source to the respective mount. Each of the first and second modules may comprise a printed circuit board, and the printed circuit board of the first module may comprise the first heat source and the printed circuit board of the second module may comprise the second heat source. In alternative embodiments, instead of a printed circuit board, at least one of the first and second modules may comprise a battery unit or pack, wherein the battery unit comprises or forms at least one of the first and second heat sources. In further alternative embodiments, at least one of the first and second modules may comprise one or more transmitters, one or more optical transducers, and/or one or more power amplifiers etc., wherein the transmitter, the optical transducer and/or the power amplifier comprise/comprises at least one of the first and second heat sources.

According to a second aspect of the disclosure, the above mentioned and other objects are achieved with an arrangement comprising a device according to any one of the appended claims 1 to 13 or according to any of the above- or below-mentioned embodiments or embodiments of the device, wherein the arrangement comprises the first mount and the second mount, wherein the first and second mounts define the space which is configured to receive and hold the device, and wherein the arrangement comprises a third heat sink thermally coupled to the first mount. An advantage of the arrangement according to the second aspect is that an improved mounting and demounting of the device and of the first and second modules are provided. Further, an improved cooling of the first module is provided via the third heat sink, which is configured to transfer heat from the first mount to air. Further advantages correspond to the advantages of the device and its embodiments mentioned above or below. In an alternative embodiment, the arrangement may be provided without the third heat sink.

In an embodiment of an arrangement according to the second aspect, the arrangement comprises a fourth heat sink thermally coupled to the second mount. An advantage with this embodiment is that an improved cooling of the second module is provided via the fourth heat sink, which is configured to transfer heat from the second mount to air.

In an embodiment of an arrangement according to the second aspect, the arrangement comprises a housing, wherein the housing comprises the first and second mounts and at least one of the third and fourth heat sinks, and wherein the housing houses the device in the space. An advantage with this embodiment is that an improved mounting and demounting of the device in a housing is provided.

The housing may be part of a network access node, an active antenna, a remote radio unit (RRU) or a base band processor. However, the housing may be a part of other units.

According to a third aspect of the disclosure, the above mentioned and other objects are achieved with a network access node for a wireless communication system, wherein the network access node comprises an arrangement according to any one of the appended claims 14 to 16 or according to any of the above- or below-mentioned embodiments or embodiments of the arrangement. Advantages of the network access node correspond to the advantages of the device and the arrangement and their embodiments or embodiments mentioned above or below. The network access node may comprise a base station.

Further applications and advantages of embodiments of the disclosure will be apparent from the following detailed description.

BRIEF DESCRIPTION OF THE DRAWINGS

The appended drawings are intended to clarify and explain different embodiments of the disclosure, in which.

DETAILED DESCRIPTION

Figure 1:
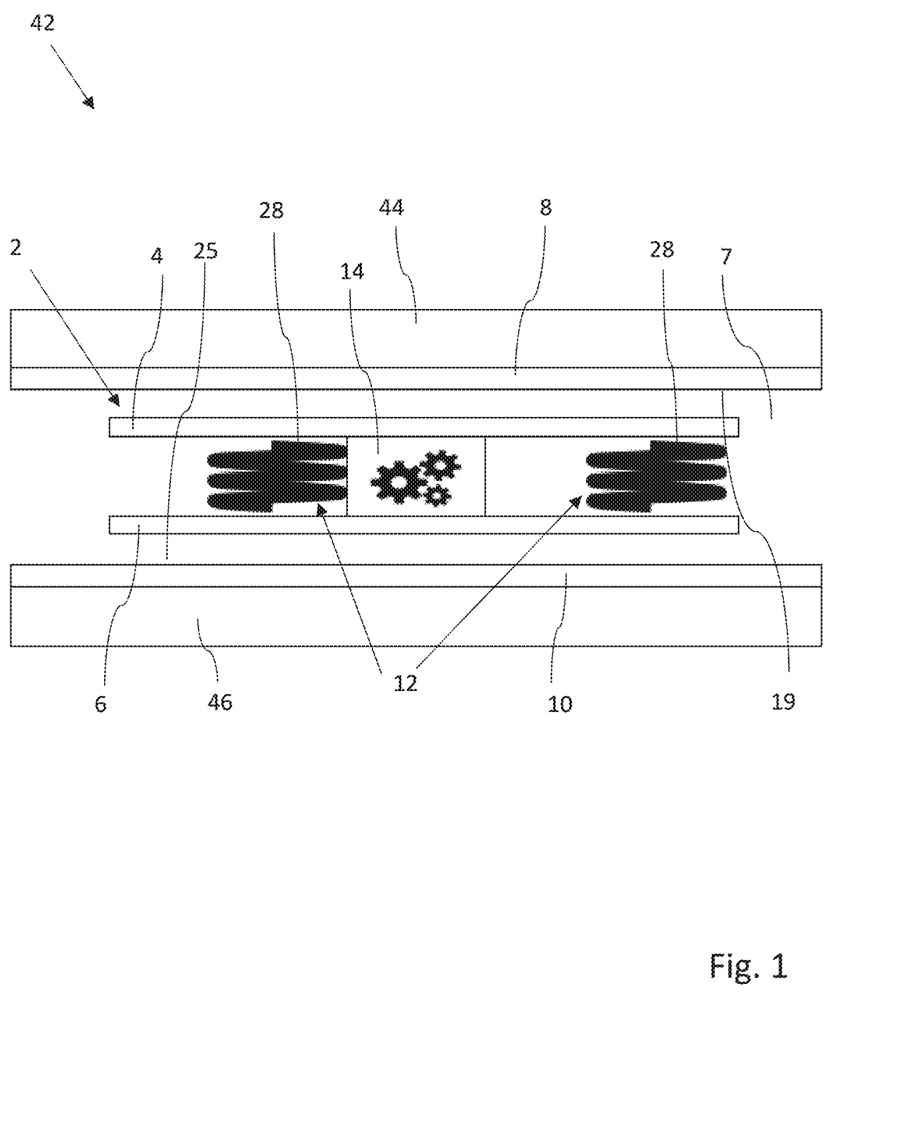
FIG. 1 is a schematic side view illustrating a first embodiment of the device according to the first aspect, when the device is in a compressed state and placed in a space or compartment.

With reference to FIG. 1, a device 2 according a first embodiment is schematically illustrated. The device 2 is configured to secure a first module 4 and a second module 6 in a space 7 between a first mount 8 and a second mount 10. The device 2 may include the first and second mounts 8, 10. In FIG. 1, the device 2 is located in the space 7 between the first mount 8 and the second mount 10. Each of the first and second mounts 8, 10 may include a flat contact surface 19, 25. However, the contact surface of the first and second mounts 8, 10 may have a shape different from flat. The device 2 includes a biasing apparatus 12 for urging the first module 4 and the second module 6 away from each other, thereby urging the first module 4 against the first mount 8 and urging the second module 6 against the second mount 10. Further, the device 2 includes a release apparatus 14 for moving the first module 4 and the second module 6 toward each other, thereby moving the first module 4 away from the first mount 8 and moving the second module 6 away from the second mount 10. An embodiment of the release apparatus 14 is disclosed in more detail in FIGS. 3 to 8. However, it is to be understood that other alternative release apparatuses may be used. For example, instead of the release apparatus 114 of the embodiment of FIGS. 3 to 8, the release apparatus 14 may comprise a set of interacting and meshing members, for example including at least one gear.

Figure 2:
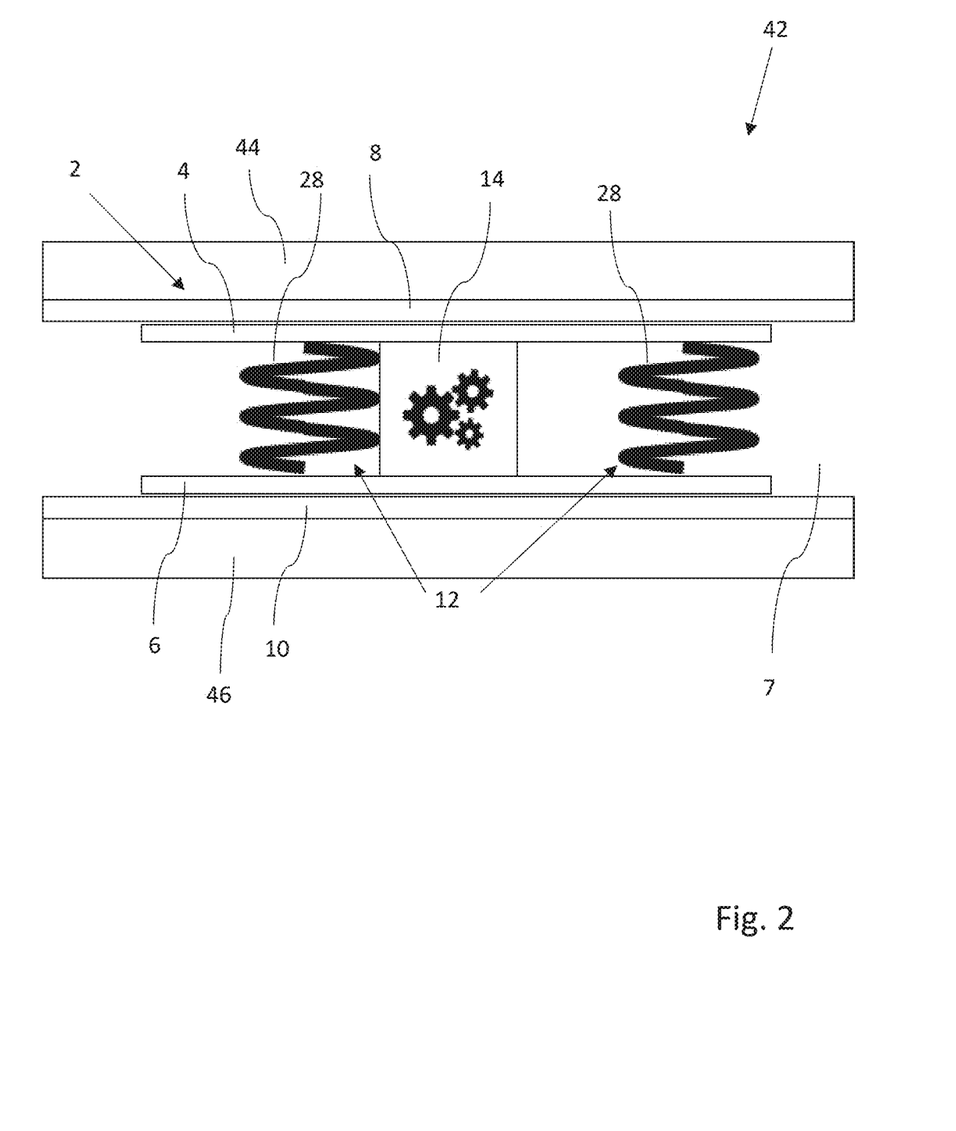
FIG. 2 is a schematic side view illustrating the device of FIG. 1, when the device is in a released or expanded state in a space or compartment.

In the embodiment of FIGS. 1 and 2, the biasing apparatus 12 includes biasing elements in the form of helical compression springs 28. However, other biasing can be used. In FIG. 1, the device 2 is in a compressed state and the first module 4 is not yet brought into contact with the first mount 8 and the second module 6 is not yet brought into contact with the second mount 10. In the compressed state shown in FIG. 1, the device 2 is easily removed from the position between the first and second mounts 8, 10 or inserted to the position between the first and second mounts 8, 10 in a lateral direction. In FIG. 2, the device 2 is in a released or expanded state, whereby the biasing apparatus 12 has urged the first module 4 against the first mount 8 and urged the second module 6 against the second mount 10. In FIG. 2, with regard to the release apparatus 14, the first module 4 and the second module 6 are released. The state of the device 2 in FIG. 2 can be described as an expanded state, since the distance between the first and second modules 4, 6 has been expanded compared to the distance between the first and second modules 4, 6 in FIG. 1. By way of the device 2, an efficient mounting of the first and second modules 4, 6 against the first and second mounts 8, 10 is provided.

With reference to FIG. 1, when the first and second modules 4, 6 are moved toward each other by the release apparatus 14, the release apparatus 14 is configured to compress the compression spring 28 such that the compression spring 28 is more compressed compared to when the first module 4 is urged against the first mount 8 and the second module 6 is urged against the second mount 10. The device 2 may be configured to transfer heat from the first module 4 to the first mount 8 and from the second module 6 to the second mount 10. A third heat sink 44 may be thermally coupled to the first mount 8, and a fourth heat sink 46 may be thermally coupled to the second mount 10 for transferring heat from the first and second mounts 8, 10 to air. Hereby, the first and second modules 4, 6 are cooled in an efficient manner, for example when each of the first and second modules 4, 6 includes a heat source. With reference to FIGS. 1 and 2, also an embodiment of the arrangement 42 according to the second aspect of the disclosure is schematically illustrated, wherein the arrangement 42 includes the first mount 8 and the second mount 10. The first and second mounts 8, 10 define the space 7 which is configured to receive and hold the device 2. The arrangement 42 may include at least one of the third heat sink 44 and the fourth heat sink 46.

Figure 3:
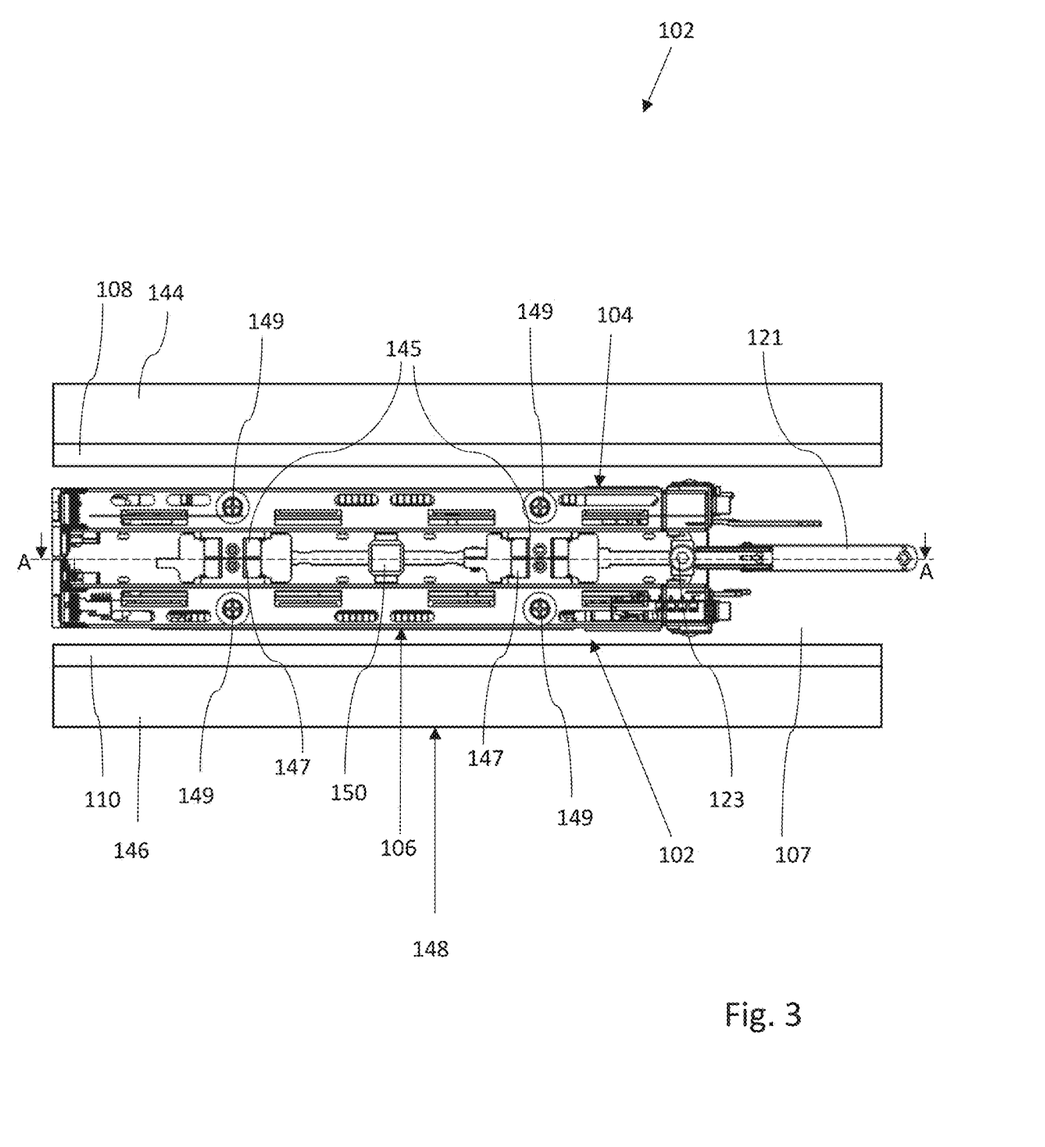
FIG. 3 is a schematic side view of a second embodiment of the device according to the first aspect, when the device is in a compressed state and placed in a space or compartment.
Figure 4:
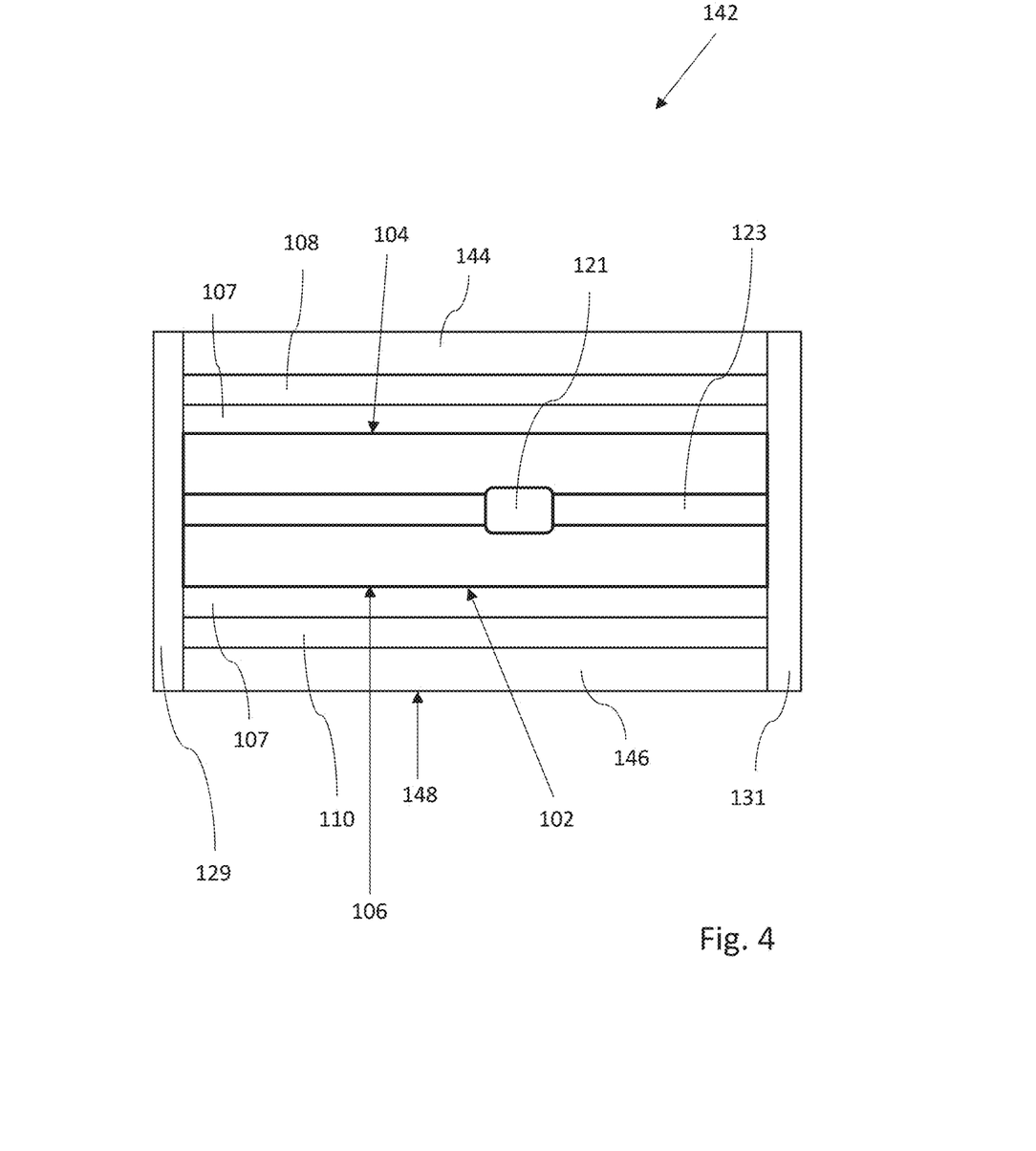
FIG. 4 is a schematic front view of the device of FIG. 3 in the compressed state.
Figure 5:
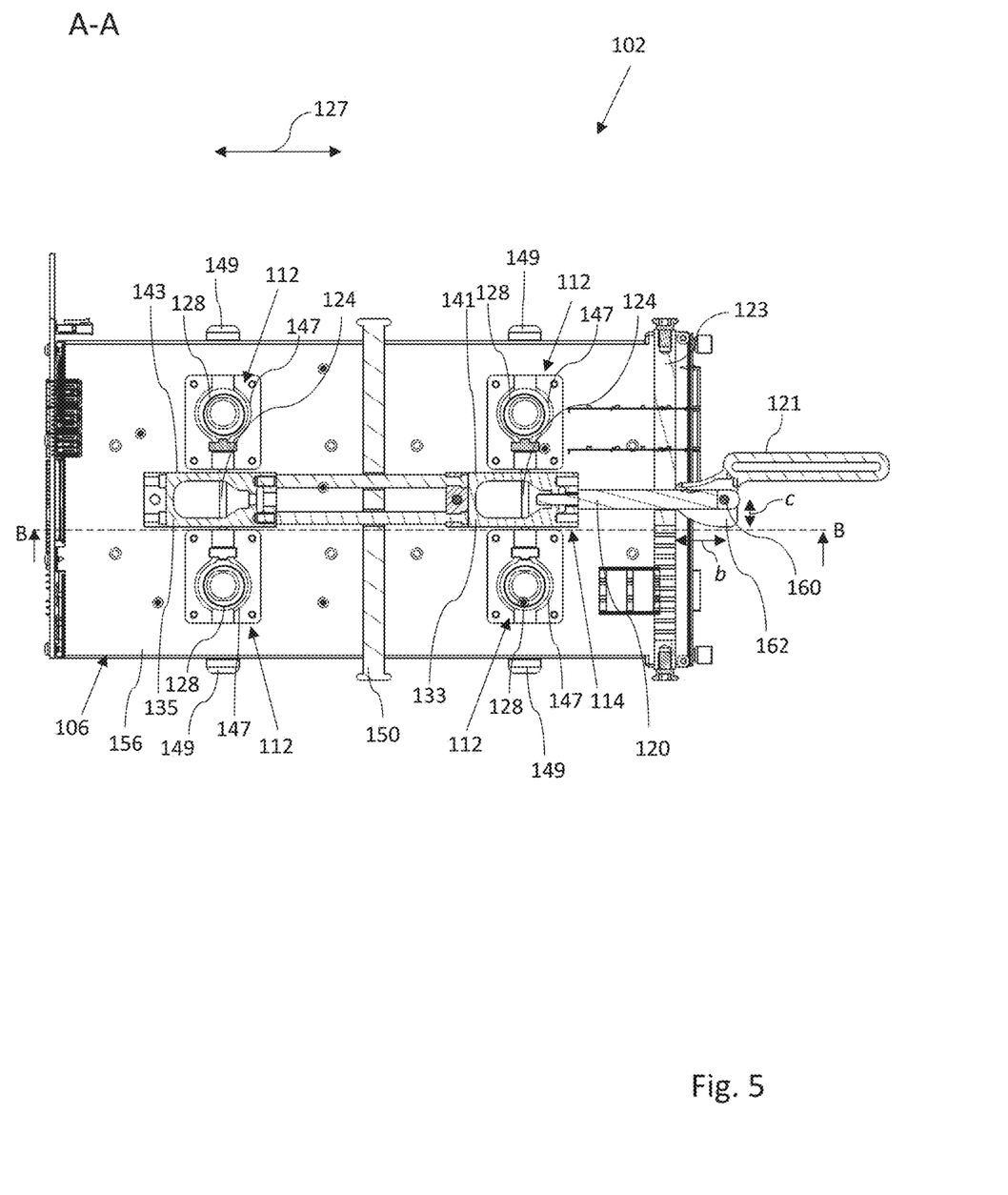
FIG. 5 schematically shows the section A-A of FIG. 3.
Figure 6:
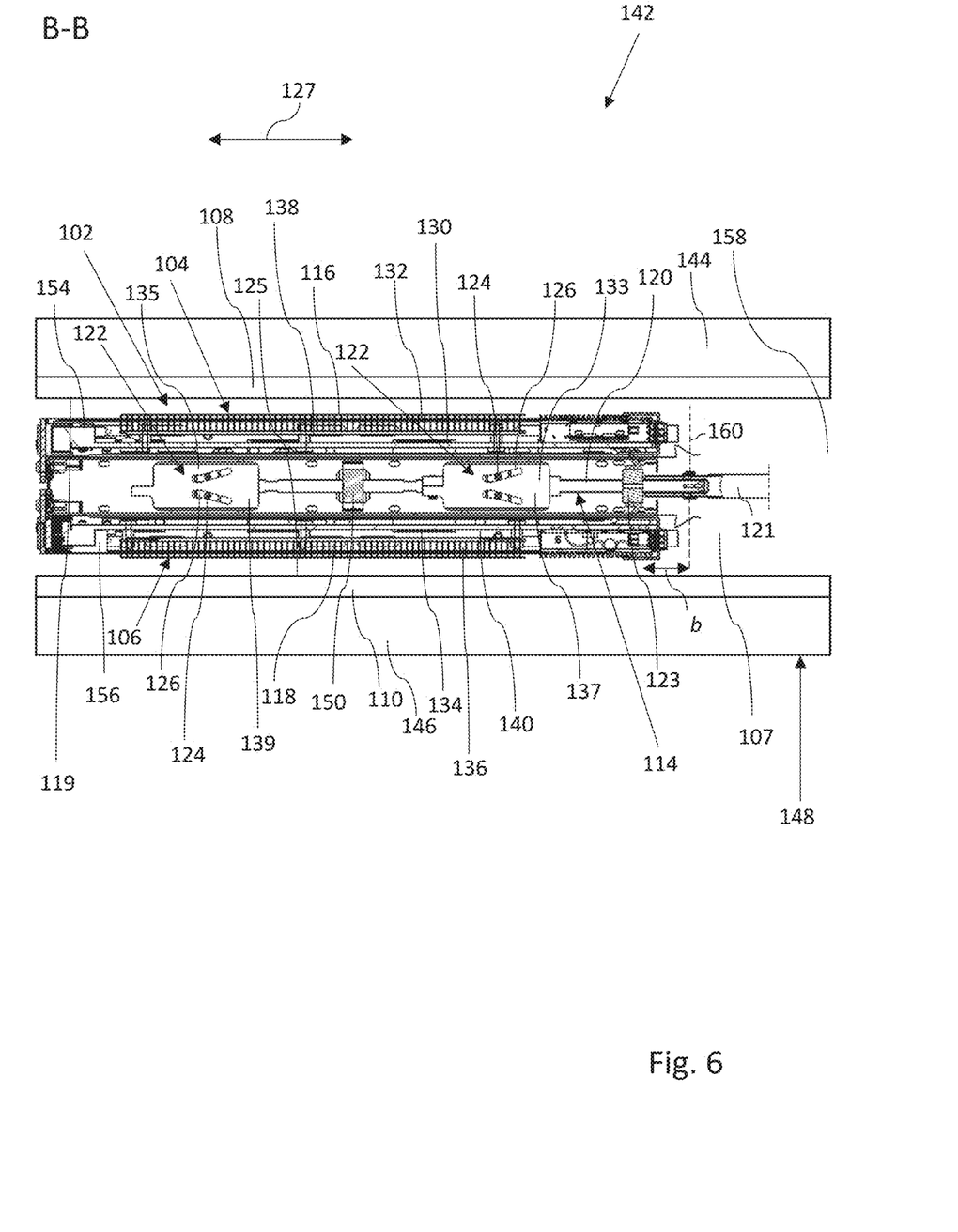
FIG. 6 schematically shows the section B-B of FIG. 5.
Figure 7:
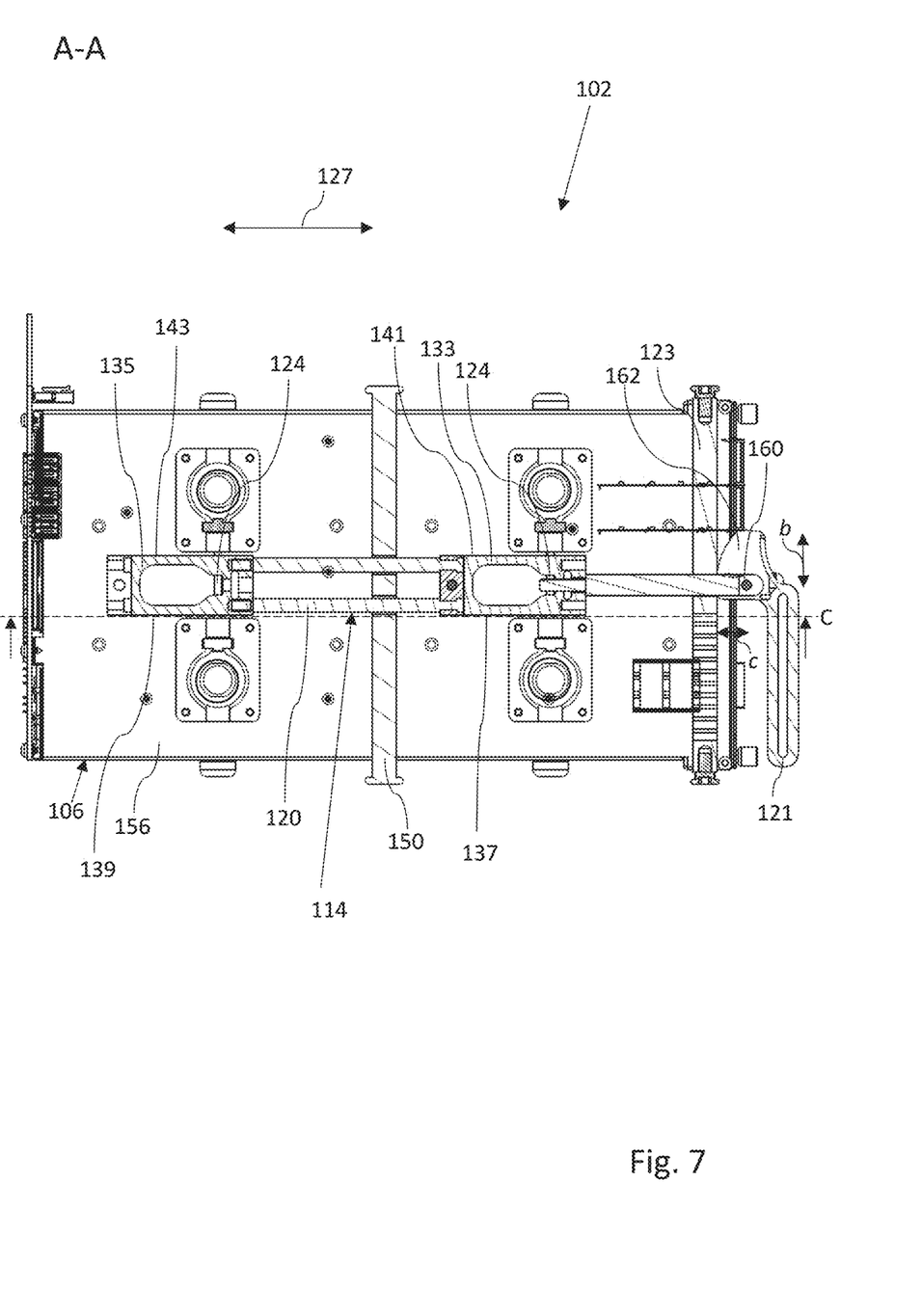
FIG. 7 schematically shows the section A-A of FIG. 3, but when the device is in a released or expanded state.
Figure 8:
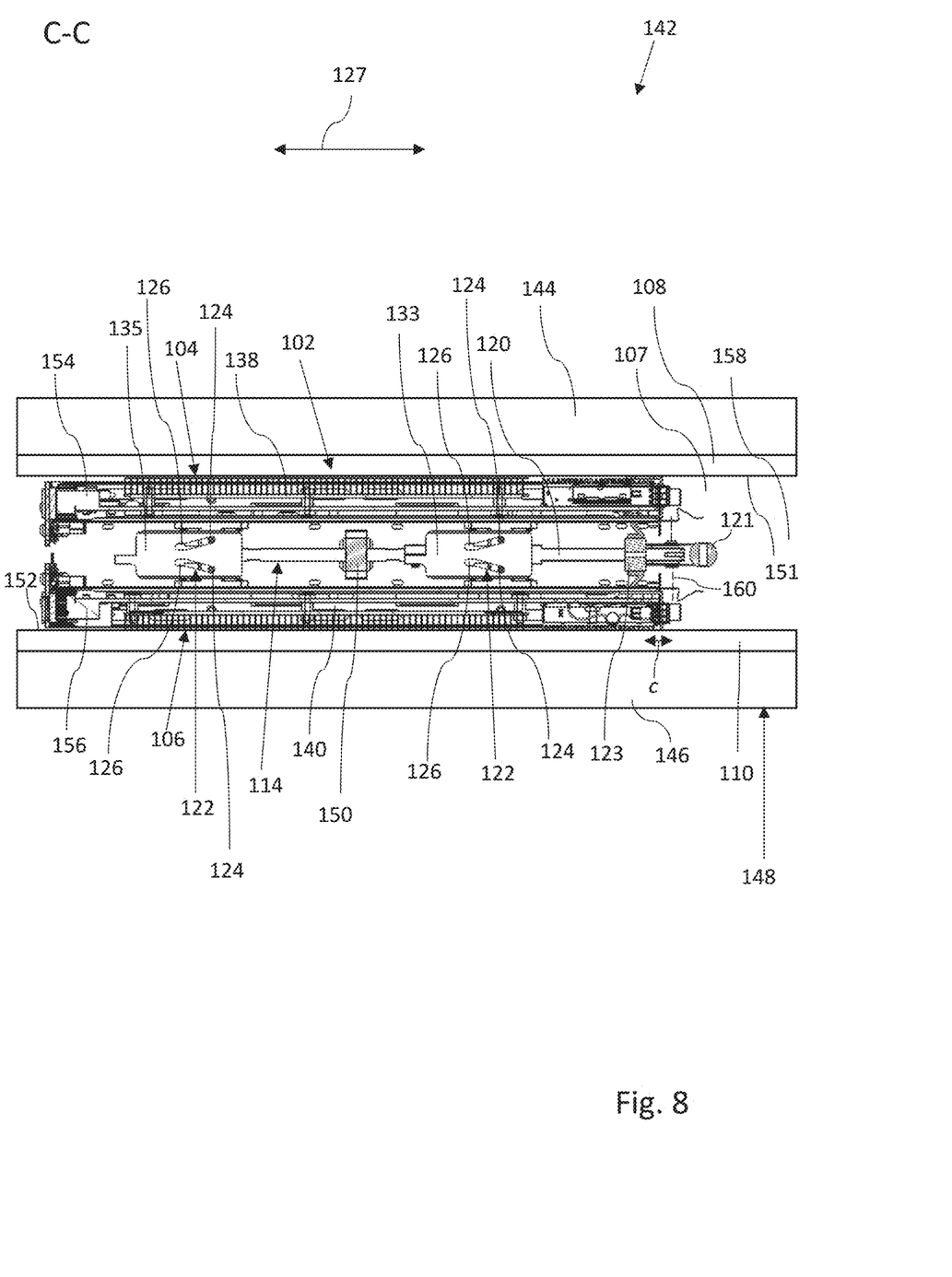
FIG. 8 schematically shows the section C-C of FIG. 7, when the device is in the released or expanded state.

With reference to FIGS. 3 to 8, a device 102 according a first embodiment is schematically shown. The device 102 is configured to secure a first module 104 and a second module 106 in a space 107 between a first mount 108 and a second mount 110. The device 102 may comprise the first module 104 and the second module 106. Each of the first and second mounts 108, 110 may include a flat contact surface 119, 125. However, the contact surface 119, 125 of the first and second mounts 108, 110 may have a shape different from flat. With reference to FIG. 5, the device 102 has a biasing apparatus 112 for urging the first module 104 and the second module 106 away from each other, thereby urging the first module 104 against the first mount 108 and urging the second module 106 against the second mount 110 and keeping the device 102 in a released or expanded state. When the first module 104 is urged against the first mount 108, the first module 104 is configured to abut against the first mount 108. When the second module 106 is urged against the second mount 110, the second module 106 is configured to abut against the second mount 110. The expanded state of the device 102 is shown in FIGS. 7 and 8. In the shown embodiment, the first mount 108 is opposite the second mount 110.

With reference to FIGS. 5-8, the device 102 also has a release apparatus 114 for moving the first module 104 and the second module 106 toward each other, thereby moving the first module 104 away from the first mount 108 and moving the second module 106 away from the second mount 110 and keeping the device 102 in a compressed state. The compressed state of the device 102 is shown in FIGS. 3 to 6. In the shown embodiment, the release apparatus 114 may be configured to move the first module 104 in relation to the second module 106 between one or more first positions and one or more second positions, wherein when the first module 104 is in the first position the biasing apparatus 112 is configured to urge the first module 104 into abutment with the first mount 108, and when the first module 104 is in the second position the first module 104 is released from its abutment with the first mount 108. Further, the release apparatus 114 may be configured to move the second module 106 in relation to the first module 104 between one or more first positions and one or more second positions, wherein when the second module 104 is in the first position the biasing apparatus 112 is configured to urge the second module 106 into abutment with the second mount 110, and when the second module 106 is in the second position the second module 106 is released from its abutment with the second mount 110. The first position of each of the first and second modules 104, 106 is shown in FIGS. 7 and 8, and the second position of each of the first and second modules 104, 106 is shown in FIGS. 3 to 6. The release apparatus 114 may be called a pulling and/or pushing apparatus, or a guiding apparatus.

The first module 104 has a first contact surface 116 configured to abut against the first mount 108, and the second module 106 has a second contact surface 118 configured to abut against the second mount 110. Each of the first contact surface 116 and the second contact surface 118 may be flat or have a shape different from flat. The release apparatus 114 is configured such that when first module 104 and the second module 106 are moved toward each other, the distance between the first contact surface 116 and the second contact surface 118 is less than the distance between the first mount 108 and the second mount 110. The distance between the first mount 108 and the second mount 110 may be the distance between the flat contact surface 119 of the first mount 108 and the flat contact surface 125 of the second mount 110.

With reference to FIGS. 5 to 8, the release apparatus 114 includes a core unit 120 located at least partly between the first module 104 and the second module 106. The core unit 120 may be elongated and may have a longitudinal extension in a longitudinal direction 127. The core unit 120 is called core unit 120 simply because it is at least partly located between the first module 104 and the second module 106 at a central location of the device 102. However, other locations of the core unit 120 are can be used. The core unit 120 may include one or more parts, for example parts directly or indirectly attached to one another. The first and second modules 104, 106 are attached to the core unit 120 and are movable in relation to the core unit 120, for example in a manner described in more detail hereinbelow. The release apparatus 114 has a grip 121, or handle, pivotally attached to the core unit 120 and configured to move the core unit 120 in the longitudinal direction 127 and thereby move the first and second modules 104, 106 in relation to the core unit 120. The grip 121 is configured to be operated or handled by the hand of a user or operator. In the shown embodiment, the core unit 120 is movable in relation to the first and second modules 104, 106 in a direction substantially parallel to the first and second contact surfaces 116, 118.

With reference to FIGS. 5 to 8, the device 102 includes a fixing element 123, for example in the form a beam or rod. The core unit 120 is movable in relation to the fixing element 123, and the first module 104 and the second module 106 are movable in relation to the fixing element 123. Further, the grip 121 is movable or rotatable in relation to the fixing element 123. The fixing element 123 may be configured to be fixed in relation to the first and second mounts 108, 110 such that the fixing element 123 is prevented from moving in relation to the first and second mounts 108, 110 in a direction substantially parallel to the first and second contact surfaces 116, 118. The fixing element 123 may have a through-hole for guiding the core unit 120. With reference to FIG. 4, the first and second mounts 108, 110 may be connected to a first side wall 129 and a second side wall 131. Thus, the space 107 may be surrounded by the first and second mounts 108, 110 and the first and second side walls 129, 131. The fixing element 123 may be configured to be fixedly attached to the first and second side walls 129, 131, for example by being fitted into recesses in the first and second side walls 129, 131. Thus, the fixing element 123 is prevented from moving in relation to the first and second mounts 108, 110 at least in a direction substantially parallel to the first and second contact surfaces 116, 118, for example at least in the longitudinal direction 127. The device 102 may also include a guiding beam 150 with through-holes for guiding the core unit 120. The guiding beam 150 may be attached to the first and second side walls 129, 131, for example by being fitted into recesses in the first and second side walls 129, 131.

With reference to FIGS. 6 and 8, the release apparatus 114 includes one or more core guides 122, each core guide 122 having a longitudinal extension. In the shown embodiment, each core guide 122 includes a groove 126 having the longitudinal extension. The core unit 120 includes two blocks 133, 135 provided with the core guides 122 and thus with grooves 126. Instead of two blocks 133, 135, the core unit 120 could include a single block. In the shown embodiment, each groove 126 is a hollow. However, the groove 126 could also be a depression. Each block 133, 135 could be solid, but in the shown embodiment, each block 133, 135 is hollow and has a first wall 137, 139 and a second wall 141, 143, as shown in FIGS. 5 to 8. Thus, with reference to FIGS. 6 and 8, in the first wall 137, 139 each block 133, 135 has two hollow grooves 126, and, with reference to FIGS. 5 and 7, in the second wall 141, 143 each block 133, 135 has two corresponding hollow grooves which mirrors the two grooves in the first wall 137, 139. With reference to FIGS. 5 to 8, each core guide 122 has a core guide member 124 movable in the core guide 122. The core guide member 124 is configured to engage the groove 126. Each core guide member 124 is attached to the first module 104 or the second module 106. The core guide 122 and thus the groove 126 are configured to hold and guide the core guide member 124. The release apparatus 114 is configured to move the first module 104 and the second module 106 in relation to each other by moving the core guide member 124 along the longitudinal extension of the core guide 122, for example the groove 126, which is disclosed in more detail hereinbelow. The longitudinal extension of the core guide 122, for example the groove 126, may be curved and/or straight. The longitudinal extension of the core guide 122, for example the groove 126, may be form an acute angle with the first and second contact surfaces 116, 118. In the shown embodiment, the core guide member 124 is shaped as a pin or rod. The pin engages two grooves 126 and is thus guided by two grooves 126. In the shown embodiment, each core guide member 124 is attached at its two ends to the first module 104 or to the second module 106 outside each block 133, 135.

With reference to FIGS. 3, 5 and 7, the biasing apparatus 112 has one or more compression springs 128. With reference to FIGS. 5 and 7, in the shown embodiment, the biasing apparatus 112 includes four compression springs 128 which are located outside the core unit 120, i.e. the core unit 120 is located between a first pair of compression springs 128 and between a second pair of compression springs 128. However, the biasing apparatus 112 may include a different number of compression springs 128, for example one, two or three. With reference to FIGS. 3 and 5, each compression spring 128 is positioned in a first seat 145 of the first module 104 and in a second seat 147 of the second module 106. Each seat 145, 147 may include a hollow cylinder, in which the compression spring 128 is seated. When the first and second modules 104, 106 are moved toward each other by the release apparatus 114, the release apparatus 114 is configured to compress the compression spring 128 such that the compression spring 128 is more compressed compared to when the first module 104 is urged against the first mount 108 and the second module 106 is urged against the second mount 110. With reference to FIG. 1, in the shown embodiment, the compression spring 128 may be a helical or coil compression spring. Alternatively, the compression spring may be a volute or conical spring, a hollow tubing spring or a spring washer etc., or another type of compression spring.

Lateral guides are provided for guiding the first module 104 between the position where the first module 104 is urged against the first mount 108 and the position where the first module 104 is moved away from the first mount 108. Further, lateral guides are provided for guiding the second module 106 between the position where the second module 106 is urged against the second mount 110 and the position where the second module 106 is moved away from the second mount 110. Each lateral guide may include a lateral groove in the first side wall 129 or the second side wall 131. With reference to FIGS. 5 and 7, each lateral guide may include a lateral guide member 149, for example a rotatable wheel, attached, for example rotatably attached, to one of the first and second modules 104, 106. The lateral guides prevent the movement of the device in the longitudinal direction 127. However, the device 102 may be provided without these lateral guides.

The first module 104 comprises a first heat source 130 or may be configured to hold a first heat source 130. The first module 104 is configured to transfer heat from the first heat source 130 to the first mount 108 when the first module 104 is urged against the first mount 108. The first module 104 is configured to be thermally coupled to the first mount 108 when the first module 104 is urged against the first mount 108. The first module 104 comprises a first heat sink 132 thermally coupled to the first heat source 130 and configured to abut against the first mount 108. However, instead of a first heat sink 132, the first module 104 may include a different kind of abutting element. The second module 106 comprises a second heat source 134, and the second module 106 is configured to transfer heat from the second heat source 134 to the second mount 110 when the second module 106 is urged against the second mount 110. The second module 106 is configured to be thermally coupled to the second mount 110 when the second module 106 is urged against the second mount 110. The second module 106 comprises a second heat sink 136 thermally coupled to the second heat source 134 and configured to abut against the second mount 110. However, instead of a second heat sink 136, the second module 106 may include a different kind of abutting element.

In the shown embodiment, each of the first and second modules 104, 106 includes a printed circuit board, PCB, 138, 140. The printed circuit board 138 of the first module 104 includes the first heat source 130, and the printed circuit board 140 of the second module 106 includes the second heat source 134. Each of the first and second heat sources 130, 134 may be a powered electrical component of the printed circuit board 138, 140. However, instead of a printed circuit board 138, 140, each of the first and second modules 138, 140 may include a different electrical component or unit, such as a battery unit or pack, one or more transmitters, one or more optical transducers, and/or one or more power amplifiers etc. The first module 104 may include an electrical component or unit different from the electrical component or unit of the second module 106, or the first and second modules 104, 106 may include similar electrical components or units. Each of the first and second modules 104, 106 includes a holder 154, 156 for holding a printed circuit board 138, 140 or another electrical component or unit. The printed circuit board 138, 140 may be slid to a locked position in the holder 154, 156 via an opening 158 of the space 107.

The device 102 and the first and second modules 104, 106 are installed or mounted as follows. Firstly, when the first mount 108 is removed, the device 102 is pushed to its position shown in FIG. 3 by sliding the lateral guide members 149 in the lateral grooves in the first and second side walls 129, 131, by sliding the fixing element 123 in its recesses in the first and second side walls 129, 131 and by sliding the guiding beam 150 in its recesses in the first and second side walls 129, 131. Thereafter, the first mount 108 is placed in its position opposite the second mount 110 as shown in FIG. 3. The first mount 108 may for example be included in a lid or cover which can be fastened in relation to the second mount 108 and thus positioned opposite the second mount 110. It is to be understood that the second mount 110 instead may be removable for positioning the device 102 in its position between the first and second mounts 108, 110. FIGS. 3 to 6 illustrate the device 102 in the compressed state, i.e. when the first module 104 and the second module 106 are moved toward one another and moved away from the first and second mounts 108, 110. With reference to FIG. 5, in the compressed state of the device 102, the longitudinal extension of the grip 121 extends in the longitudinal direction 127. The grip 121 is indirectly pivotally attached to the core unit 120 at a pivot axis 160 and thus pivotable in relation to the core unit 120 about the pivot axis 160. The grip 121 is attached to the core unit 120 via a curved abutment member 162, which adjoins the grip 121. The abutment member 162 abuts against the fixing element 123 with a curved side of the abutment member 162. From the pivot axis 160, the abutment member 162 extends a distance b in the same direction as the longitudinal extension of the grip 121 to the curved side of the abutment member 162. From the pivot axis 160, the abutment member 162 extends a distance c in a direction transverse to the direction of the longitudinal extension of the grip 121 to the curved side of the abutment member 162. The distance b is longer than the distance c. When the longitudinal extension of the grip 121 extends in the longitudinal direction 127, i.e. when the longitudinal extension of the grip 121 extends transversely to the longitudinal extension of the fixing element 123, the abutment member 162, through the distance b, pulls or moves the core unit 120, in relation to the fixing element 123, in the longitudinal direction 127 in the direction toward the grip 121. Consequently, with reference to FIG. 6, the blocks 133, 135 of the core unit 120 and their grooves 126 are pulled or moved, in relation to the core guide members 124 and the fixing element 123, in the longitudinal direction 127 in a direction toward the grip 121 and the fixing element 123. Because of the acute angle formed between each groove 126 and the first and second contact surfaces 116, 118, the core guide member 124 of the first module 104 is pulled or moved towards the core guide member 124 of the second module 106, and consequently, the first module 104 and the second module 106 are moved toward one another or held close to one another. Thus, the first module 104 is moved away or held at distance from the first mount 108, and the second module 106 is moved away or held at distance from the second mount 110. Thus, the first module 104 and the first mount 108 are spaced apart, and the second module 106 and the second mount 110 are spaced apart.

With reference to FIGS. 7 and 8, which illustrate the device 102 in the expanded state, for urging the first module 104 and the second module 106 away from each other, thereby urging the first module 104 against the first mount 108 and urging the second module 106 against the second mount 110, the grip 121 is rotated about the pivot axis 160 such that the longitudinal extension of the grip 121 extends substantially parallel to the longitudinal extension of the fixing element 123 and/or such that the longitudinal extension of the grip 121 extends substantially transversely to the longitudinal direction 127, as shown in FIG. 7. By positioning the grip 121 in the position as shown in FIG. 7, the abutment member 162, through the distance c, which is shorter than the distance b, pushes or moves the core unit 120, in relation to the fixing element 123, in the longitudinal direction 127 in a direction away from the grip 121. Consequently, with reference to FIG. 8, the blocks 133, 135 of the core unit 121 and their grooves 126 are pushed or moved, in relation to the core guide members 124 and the fixing element 123, in the longitudinal direction 127 in the direction away from the grip 121 and the fixing element 123. Because of the acute angle formed between each groove 126 and the first and second contact surfaces 116, 118, the core guide member 124 of the first module 104 is pushed or moved away from the core guide member 124 of the second module 106, and consequently, the first module 104 and the second module 106 are pushed or moved away from one another and thereby allowing the biasing apparatus 112 to urge the first module 104 and the second module 106 away from each other and urge the first module 104 against the first mount 108 and urge the second module 106 against the second mount 110. Thus, the first module 104 and the second module 106 are pushed or moved to abutment with the first and second mounts 108, 110, respectively, by the biasing apparatus 112, for example by the compression springs 128. When the first module 104 and the second module 106 include a holder 154, 156 for holding a printed circuit board 138, 140, and the holder 154, 156 holds a printed circuit board 138, 140, and the first module 104 and the second module 106 are in the abutting position shown in FIGS. 7 and 8, and the printed circuit board 138, 140 is to be replaced by a new printed circuit board 138, 140, the grip 121 is moved or rotated to the position shown in FIGS. 5 and 6. Then, the printed circuit boards 138, 140 are released from the first and second mounts 108, 110 and the printed circuit board 138, 140 can be slid out of the holder 154, 156 in the longitudinal direction 127 and removed, and replaced by the new printed circuit boards 138, 140. The new printed circuit boards 138, 140 are also slid into their position in the holders 154, 156. For this purpose, the holders 154, 156 may be provided with guides. Thereafter, the grip 121 is moved or rotated back to the position shown in FIGS. 7 and 8, and the new printed circuit boards 138, 140 are brought to abutment with the first and second mounts 108, 110. The same procedure is applied for other electrical components or units instead of the printed circuit boards 138, 140. Further, in the shown embodiment, the biasing apparatus 112 is configured to pull and keep the grip 121 in the position shown in FIGS. 7 and 8 and prevent the grip 121 from unintentionally moving or rotating toward the position shown in FIGS. 5 and 6 without the active operation of an operator or user.

With reference to FIGS. 3, 4, 6 and 8, an arrangement 142 is also provided, wherein the arrangement 142 includes a device 102 according to any of the embodiments disclosed above. The arrangement 142 includes the first mount 108, the second mount 110, the first side wall 129 and the second side wall 131. The first and second mounts 108, 110 and the first and second side walls 129, 131 define the space 107 which is configured to receive and hold the device 102. In the shown embodiment, the first mount 108 includes a first inner surface 151 and the second mount 110 includes a second inner surface 152. Each of the first inner surface 151 and the second inner surface 152 may include a flat contact surface 119, 125. The inner contact surface 119, 125 may have a shape different from flat. The arrangement 142 may include a third heat sink 144 thermally coupled to the first mount 108 and a fourth heat sink 146 thermally coupled to the second mount 110. The shown arrangement 142 has a housing 148, or casing. The housing 148 includes the first and second mounts 108, 110 and the third and fourth heat sinks 144, 146. The housing 148 is configured to house the device 102 in the space 107. The arrangement 142 may be installed such that the opening 158 of the space 107 opens downward, upward or to the side, or therebetween.

The embodiments of the present disclosure also comprise a network access node for a wireless communication system, wherein the network access node comprises a device 2, 102 and/or an arrangement 42, 142 according to any one of the embodiments disclosed above. The network access node may comprise a base station, for example a radio base station. The network access node may include an active antenna, a remote radio unit (RRU) or a base band processor. The network access node may include one or more antennas. The base station may have a housing which houses the antenna. Alternatively, the antenna is mounted outside the housing of the base station, for example with a distance to the housing of the base station.

Finally, it should be understood that the disclosure is not limited to the embodiments described above, but also relates to and incorporates all embodiments within the scope of the appended independent claims.

What is claimed is:

1. A device for securing a first module and a second module in a space between a first mount and a second mount, the device comprising:
  a biasing apparatus to urge the first module and the second module away from each other, wherein the first module is to be urged against the first mount and the second module is to be urged against the second mount; and
  a release apparatus for moving the first module and the second module toward each other, wherein the first module is to be moved away from the first mount and the second module is to be moved away from the second mount.

2. The device according to claim 1, wherein the first module has a first contact surface configured to abut against the first mount, wherein the second module has a second contact surface configured to abut against the second mount, and wherein the release apparatus is configured such that when first module and the second module are moved toward each other a distance between the first contact surface and the second contact surface is less than a distance between the first mount and the second mount.

3. The device according to claim 1, wherein the release apparatus comprises a core unit located at least partly between the first module and the second module, wherein the first module and the second module are attached to the core unit and movable in relation to the core unit, and wherein the release apparatus comprises a grip attached to the core unit and configured to move the core unit, which is to move the first module and the second module in relation to the core unit.

4. The device according to claim 3, wherein the device comprises a fixing element, wherein the core unit is movable in relation to the fixing element, wherein the first module and the second module are movable in relation to the fixing element, and wherein the grip is movable in relation to the fixing element.

5. The device according to claim 2, wherein the release apparatus comprises one or more core guides, wherein each core guide has a longitudinal extension and a core guide member movable in the core guide, wherein the core guide is configured to hold and guide the core guide member, and wherein the release apparatus is configured to move the first module and the second module in relation to each other by moving the core guide member along the longitudinal extension of the core guide.

6. The device according to claim 5, wherein the longitudinal extension of the core guide forms an acute angle with the first contact surface and the second contact surface.

7. The device according to claim 5, wherein the core guide comprises a groove having the longitudinal extension, wherein the core guide member is configured to engage the groove and is movable in the groove, and wherein the release apparatus is configured to move the first module and the second module in relation to each other by moving the core guide member along the longitudinal extension of the groove.

8. The device according to claim 1, wherein the biasing apparatus comprises one or more compression springs, and wherein when the first module and the second module are moved toward each other by the release apparatus the release apparatus is to compress the one or more compression springs such that the one or more compression springs are more compressed compared to when the first module is urged against the first mount and the second module is urged against the second mount.

9. The device according to claim 1, wherein the first module comprises a first heat source, and wherein the first module is configured to transfer heat from the first heat source to the first mount when the first module is urged against the first mount.

10. The device according to claim 9, wherein the first module comprises a first heat sink thermally coupled to the first heat source and configured to abut against the first mount.

11. The device according to claim 9, wherein the second module comprises a second heat source, and wherein the second module is configured to transfer heat from the second heat source to the second mount when the second module is urged against the second mount.

12. The device according to claim 11, wherein the second module comprises a second heat sink thermally coupled to the second heat source and configured to abut against the second mount.

13. The device according to claim 11, wherein at least one of the first module and the second module comprises a printed circuit board, and wherein the printed circuit board comprises at least one of the first heat source and the second heat source.

14. An arrangement, comprising:
a device;
a first mount;
a second mount; and
a third heat sink thermally coupled to the first mount, wherein the first mount and the second mount define a space which is configured to receive and hold the device, wherein the device comprises:
a biasing apparatus for urging a first module and a second module away from each other, wherein the first module is to be urged against the first mount and the second module is to be urged against the second mount, and
a release apparatus for moving the first module and the second module toward each other, wherein the first module is to be moved away from the first mount and the second module is to be moved away from the second mount.

15. The arrangement according to claim 14, further comprising:
a fourth heat sink thermally coupled to the second mount.

16. The arrangement according to claim 15, further comprising:
a housing, wherein the housing comprises the first mount, the second mount, and at least one of the third heat sink and the fourth heat sink, and wherein the housing houses the device in the space.

17. The arrangement according to claim 14, wherein the first module has a first contact surface configured to abut against the first mount, wherein the second module has a second contact surface configured to abut against the second mount, and wherein the release apparatus is configured such that when the first module and the second module are moved toward each other a distance between the first contact surface and the second contact surface is less than a distance between the first mount and the second mount.

18. A network access node for a wireless communication system, wherein the network access node comprises an arrangement, where the arrangement comprises:
a device;
a first mount;
a second mount; and
a third heat sink thermally coupled to the first mount, wherein the first mount and the second mount define a space which is configured to receive and hold the device, where the device comprises:
a biasing apparatus for urging a first module and a second module away from each other, wherein the first module is urged against the first mount and the second module is to be urged against the second mount, and
a release apparatus for moving the first module and the second module toward each other, wherein the first module is to be moved away from the first mount and the second module is to be moved away from the second mount.

19. The network access node according to claim 18, wherein the network access node further comprises:

a fourth heat sink thermally coupled to the second mount.

20. The network access node according to claim 19, wherein the network access node further comprises:

a housing wherein the housing comprises the first mount, the second mount, and at least one of the third heat sink and the fourth heat sink, and wherein the housing houses the device in the space.

* * * * *